United States Patent [19]

Utner

[11] Patent Number: 5,041,696
[45] Date of Patent: Aug. 20, 1991

[54] CHIP COMPONENT FOR FASTENING TO A CIRCUIT BOARD, COMPRISING AN ELECTRICAL OR ELECTRONIC FUNCTION MEMBER

[75] Inventor: Ferdinand Utner, Regensburg, Fed. Rep. of Germany

[73] Assignee: Siemens Aktiengesellschaft, Munich, Fed. Rep. of Germany

[21] Appl. No.: 341,220

[22] Filed: Apr. 21, 1989

[30] Foreign Application Priority Data

Apr. 21, 1988 [DE] Fed. Rep. of Germany ....... 3813435

[51] Int. Cl.[5] ................... H01L 23/02; H01L 39/02; H01G 1/14
[52] U.S. Cl. .................................. 174/52.4; 361/310; 357/80
[58] Field of Search ..................... 174/52.4, 52.3, 52.2, 174/52.1; 357/80, 75, 74, 70; 361/310, 383, 392, 394

[56] References Cited

U.S. PATENT DOCUMENTS 4,499,524  2/1985  Shioleno .
4,617,609  10/1986 Utner et al. .
4,663,824  5/1987  Kenmochi .
4,734,819  3/1988  Hernandez et al. ............... 361/306

FOREIGN PATENT DOCUMENTS 0162149  11/1985  European Pat. Off. .
1064127  8/1959   Fed. Rep. of Germany .
 333293  3/1985   Fed. Rep. of Germany .
3705868  9/1988   Fed. Rep. of Germany .
60-191316 9/1985  Japan .

OTHER PUBLICATIONS

"Feature Articles/Capacitors", JEE, Nov. '82, pp. 47-50.

Primary Examiner—Leo P. Picard
Assistant Examiner—Bot Lee Ledynh
Attorney, Agent, or Firm—Hill, Van Santen, Steadman & Simpson

[57] ABSTRACT

A chip component incorporating an electrical or electronic function member (2) and having terminal elements (7, 8) is integrated in a pre-fabricated housing (9) of cup shape composed of insulating material, with the function member (2) being held in the housing (9) by supporting elements (12) so as to form at least one air gap (10) that is 1 mm less wide and that separates the function member (2) from the inner housing surfaces (11) on all sides except where the function member (2) is fixed in the housing (9) with small-area supporting elements (12).

19 Claims, 2 Drawing Sheets

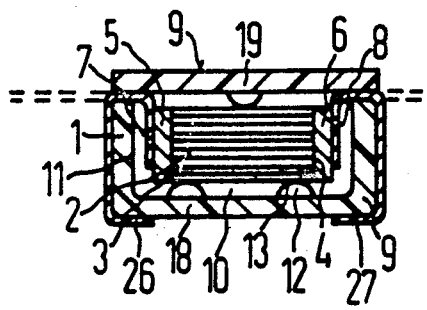
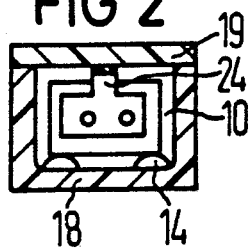
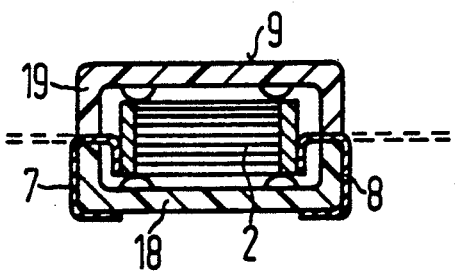
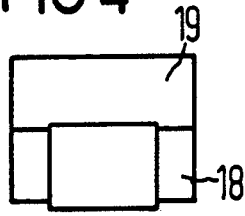
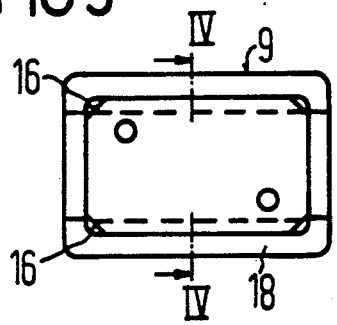
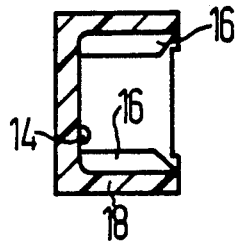
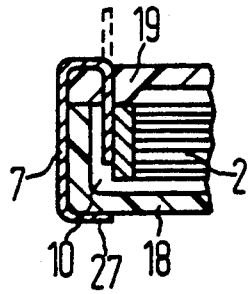
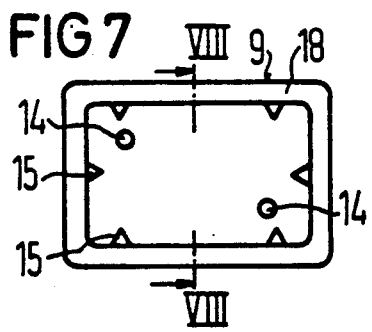
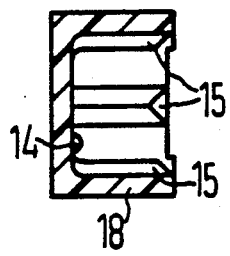
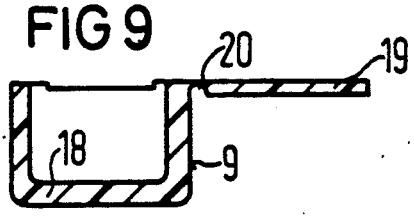
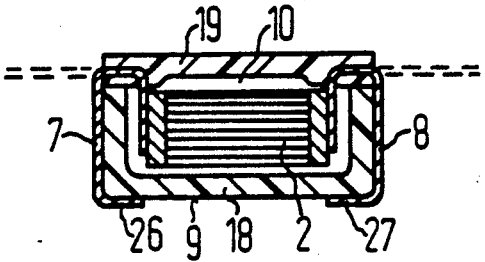

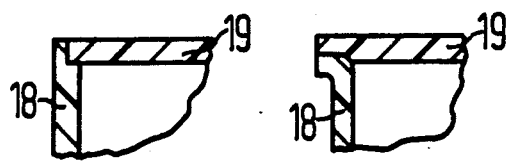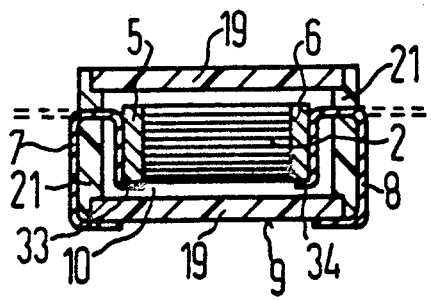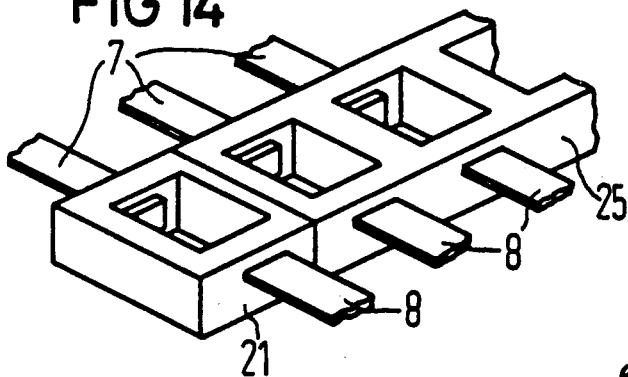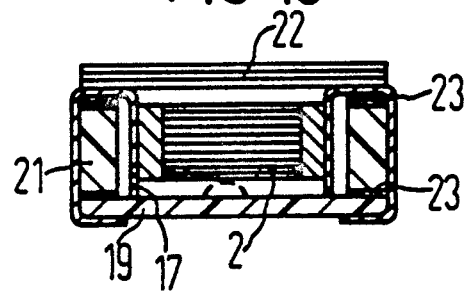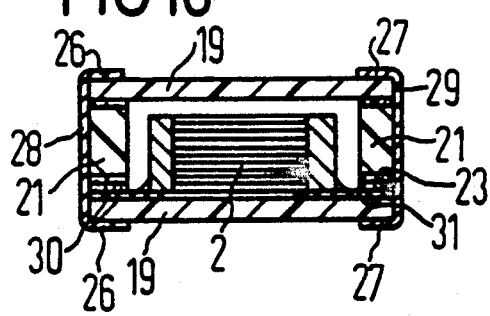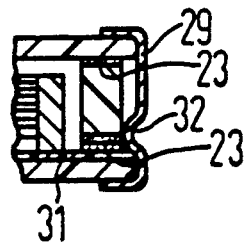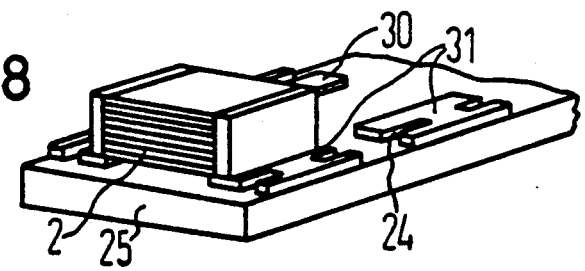

CHIP COMPONENT FOR FASTENING TO A CIRCUIT BOARD, COMPRISING AN ELECTRICAL OR ELECTRONIC FUNCTION MEMBER

BACKGROUND OF THE INVENTION

The invention is directed to a chip component adapted for fastening to a circuit board comprising an electrical or electronic function member that is provided with coatings on at least two outside surfaces, that has band-shaped terminal elements for connecting the coatings to contact locations of a printed circuit situated on the circuit board, and in which the function member is built into a prefabricated housing in cup form composed of insulating material from which the terminal elements are conducted to the exterior to form contact surfaces.

A component comprising these features is shown in FIG. 7 and described in the appertaining text of DE-AS 10 64 127.

Following upon the efforts for miniaturizing electronic circuits, a new, space-saving technology also prevailed in the housing forms of discrete components. The currently smallest housing form is that of the surface-mounted devices (SMD) that are also referred to as chip components. Characteristic of these surface-multiple components is that both the member as well as the contact locations in them are situated on the interconnect side of circuit boards. In contrast to traditional, wired components whose terminal elements are conducted through holes in the circuit board onto the other side thereof in order to be soldered to the respective contact locations there, SMD components must themselves be resistant to soldering.

Since the SMD components are directly exposed to the soldering process, the materials employed must be designed for the wave soldering, immersion soldering or reflow soldering methods that are currently standard. The components are thereby exposed to a temperature of 260° C. and more for about 10 seconds. Dependent on the specific electrical or electronic function members to be protected, SMD technology therefore requires that one or more additional protective measures be undertaken in order to guarantee the heat resistance of the component during the soldering process.

Such components together with protective measures therefor are known for components such as film capacitors.

German Published Application 34 12 492 (corresponding to European Patent A 0 162 149 or, respectively, U.S. Pat. No. 4,617,609), for example, discloses a chip component capacitor wherein the capacitor member is coated with a cuboid envelope and is protected by a heat trap. The heat conduction between the solder bath and the capacitor is diminished on the basis of a cross sectional variation of the terminal elements.

It is presently mainly the measures of tempering and the selection of special materials for the insulating housing or providing a great wall thicknesses thereof that are employed in order to be able to keep the changes in the electrical values of the capacitor member reliably within the prescribed limits as a consequence of the immersion soldering process for example, the relative change in capacitance must not exceed 2%. The enveloping of MK capacitors with high-temperature-proof thermoplastics that have good heat insulation such as PPS (polyphenylensulfide) is also disclosed, for example, in German Published Application 34 12 492.

The present invention can be employed for all chip components; however, it is preferably employed for those chip components whose function members are heat-sensitive. For example, capacitors having plastic as a dielectric that carries a thin metallization (MK capacitors), tantalum and ceramic capacitors, resistors, thermistors and posistors, inductances, relays, semiconductors, hybrid circuits, etc. are such chip components.

Up to now, the housings of the chip components are manufactured in that the function members are coated or, respectively, injection coated. This execution of the chip components is problematical for several reasons: first, this requires the acquisition of expensive extruding machines or, respectively, expensive transfer molding forms. Moreover, long curing times of the housing material and high dead head losses amounting to up to 50% of the material consumption must be accepted.

During the coating or injection molding process, second, the function members of the components have their electrical values changed to a greater or lesser degree due to the temperatures, pressures and mass stream velocities (abrasion) that thereby occur. This can lead to what is often a considerable reject rate.

Further, there is the risk that crack formations in the enveloping housing will appear during the immersion soldering process. The reason for this is that the function member exerts a mechanical load onto the walls of the enveloping housing during thermal stressing. The risk of crack formations can be avoided in that the wall thicknesses of the housing are increased by 50 through 80%, i.e. to 0.7 mm and more. In addition to an increase in the cost of materials, of course, this also involves an enlargement of the dimensions of the chips.

Finally, what is referred to as a deflashing is necessary after the coating or, respectively, injection molding process. Slight quantities of the injection molding compound are thereby removed, these having penetrated through seams to locations which contact the component and having adhered there.

For the specific case of metallized plastic capacitors, the application of this prior technique involves the special disadvantage that the component or function member must be tempered in a relatively involved procedure before the immersion soldering process in order to obtain an adequate resistance to temperature. The capacitance of the capacitors is reduced due to this manufacturing step and additional rejects can arise, this leading to increased manufacturing costs overall.

SUMMARY OF THE INVENTION

The object of the present invention is to design a component of the species initially cited such that the demands made of the heat resistance and of the mechanical strength, particularly in view of the immersion soldering process, are even better met insofar as possible without thereby requiring complicated and expensive measures such as, for example, component tempering or the techniques of injection enveloping or, respectively, transfer molding enveloping.

In order to achieve this object, the component of the species initially cited is inventively characterized in that the function member is held in the housing by supporting elements forming at least one air gap that is 1 mm and less wide and separates the function member from the inner housing surfaces on all sides except where the function member is fixed in the housing with the supporting elements whose supporting surfaces are extremely small in comparison to the surface of the function member.

The clearance of the air gap can amount to a few tenths of a millimeter, preferably 0.1 mm through 0.3 mm.

The wall thickness of the housing can amount to 0.1 through 0.7 mm, preferably 0.2 through 0.4 mm.

The supporting elements can be fashioned as spacer bosses, ribs or as bevelled corners and can be either coapplied to the cup and to its cover, or applied, for example, by being coined preceding or following the component integration, or they can be formed by parts of the terminal elements that project from the function member. The housing can be bipartite and can be composed of duroplastics or of thermoplastics. The two parts of the housing can be a cup with cover, whereby these can particularly have the shape of two half-shells. The cover can be co-applied to the cup via a hinge and/or the terminal elements can be co-injected into the cover.

The housing can also be formed of a housing frame comprising injected terminal elements and two covers.

It is that the cover is sealed either by heat deformation or by ultrasound welding or gluing.

Further, the housing and cover can be formed of punched or layered hard paper strips or hard fabric strips, whereby these are joined by gluing or with prefabricated, multi-layer plies (sometimes referred to as prepregs). The housing parts can also be formed of an exclusive layering of prefabricated, multi-layer plies (prepregs).

The housing can also be composed of a frame and of two covers, whereby the terminal elements are bipartite and are formed of terminal caps situated outside of the housing as well as of floor sections composed of a laminate that is copper-laminated on one side or on both sides, these floor sections being secured to one of the covers and the function member with its coatings as well as the housing frame resting thereupon, it being soldering firmly to its copper track, and these floor sections producing an electrically conductive connection to the outer terminal surfaces.

The terminal elements can also be composed of sheet metal that is already pre-plated with tin. This achieves the advantage that no thermal stressing of the tin surface occurs during the processing.

Last but not least, it is advantageous when an additional sealing and/or an adhesion-promoting coat is present at the passage of the terminal elements through the plastic of the housing. This produces the advantage of an improved moisture tightness. In that section that lies at least significantly inside this housing, the terminal elements can comprise at least one constriction serving as a heat trap and can thus additionally contribute to the heat insulation. The components can be advantageously manufactured either individually or from a composite of individual housings in strips or in band form having following detachment by sawing, punching or laser separating methods.

Among others, the advantages of the invention also include the fact that the air space guarantees an extremely good heat insulation with its thermal conductivity that is poorer by a factor 10 through 30 when compared to duroplastics as well as thermoplastics, and simultaneously functions as a mechanical buffer for the thermal expansion of the function member and therefore enables low housing thicknesses, for example only about 0.3 mm thick, whereby no additional measures such as, for example, component tempering before the immersion soldering process must be undertaken for the standard component sizes. Integration of the function member of the component into, for example, a housing composed of cup and cover can be implemented in a simple and economical fashion. The problems involved with the otherwise standard technique of coating or, respectively, of transfer molding are eliminated; on the other hand, the plug-in of the function members provided with terminal elements into the housing as well as the cover mounting can take place rapidly with relatively little machine outlay. All customer requirements with respect to an exact outside configuration of the chip components for reasons, for example, of equipping reliability can be met even better than with coated embodiments since, for example, no ejector markings are present at the outside surfaces of the housing.

BRIEF DESCRIPTION OF THE DRAWINGS

The invention shall be set forth in greater detail below with reference to the exemplary embodiments shown in the figures, in which:

FIG. 1 illustrates a section along the long side of a component executed as a cup with a cover;

FIG. 2 illustrates a section along the narrow side of the same embodiment;

FIG. 3 illustrates a section along the long side of an embodiment comprising two half-shells;

FIG. 4 is a view of the narrow side of the same embodiment;

FIGS. 5, 6, 7 and 8 illustrate preferred embodiments of the fixing and centering of the function member;

FIGS. 9, 10 and 11 illustrate further embodiments of the invention;

FIG. 12 illustrates special embodiments of the connection between a cup and a cover; and FIGS. 13, 14, 15, 16, 17 and 18 illustrate special embodiments of the invention comprising housing frames and covers.

DESCRIPTION OF THE PREFERRED EMBODIMENTS

FIG. 1 shows a component 1 that is composed of a function member 2 comprising outside surfaces 3 and 4 and coatings 5 and 6 to which terminal elements are secured and is further composed of a housing 9. According to FIG. 1, the terminal elements 7 and 8 emerge from the plastic material of the housing 9 at the level of the seam between the cup 18 and the cover 19 of the housing 9 and then bent over proceeding along the surface, so that contact surfaces 26 and 27 are present at the underside of the cup 18. The component is connected to the appertaining locations of the printed circuit board at these contact surfaces by soldering.

The function member 2 is retained in the housing 9 by supporting elements 12 in the form of spacer bosses 12 and 14. Apart from the relatively small supporting surfaces 13 of the supporting elements, the function member 2 is surrounded on all sides by an air gap 10 and the latter separates it from the inside housing surfaces 11.

FIG. 2 shows a component from a different perspective that corresponds to that of FIG. 1, showing a constriction 24.

FIG. 3 shows a housing 9 that is composed of two half-shells, one being fashioned as a cup 18 and the other as a cover 19. The same housing is shown in a side view in FIG. 4.

The possibilities of centering and fixing the function member 2 in the housing with bevelled corners 16, spacer bosses 14 or, respectively, with ribs 15 are shown in FIGS. 5 through 8. Such measures are already known for electrical components cast in cured plastic and, for example, are disclosed in German Published Application 37 045 868 and European Application 88 102 631.4 (VPA87P1094). FIGS. 6 and 8 thereby each show a section along the lines IV or, respectively, VIII in FIGS. 5 and, respectively, 7.

FIG. 9 shows a housing 9 wherein the cover 19 is connected to the cup 18 of one piece on the basis of a flexible hinge 20.

FIG. 10 shows an embodiment wherein the terminal elements 7 and 8 are injected to the prefabricated cover 19, whereby they are conducted laterally out of the housing 9 and are bent over as described with respect to FIG. 1.

FIG. 11 shows a similar component wherein, however, the terminal elements 7 and 8 are injected into the cover 19 so that they emerge at the upper side of the housing 9 and are then conducted along the outside surface and form the terminal surfaces 26 and 27 at the floor.

FIG. 12 shows two inherently known embodiments of the connection of the cup 18 to the cover 19 by sealing, as set forth above. The sealing of the housing parts 18 and 19 can be accomplished, for example, by heat deformation, particularly by a heating die, with heated air, treatment with an open flame or by laser beams.

FIG. 13 shows a component in which the housing 9 is composed of a housing frame 21 comprising injected terminal elements 7 and 8 as well as of two covers 19. The covers 19 are sealed to the housing frame 21 as set forth above.

FIG. 14 schematically shows how the component of FIG. 13 can be manufactured. A composite 25 of housing frames 21 for individual housings is prepared with the terminal elements 7 and 8 injected through the side walls. After the insertion of the function members 2 (see FIG. 13) onto the seats 33 and 34 and after mechanical and electrical connection of their coatings 5 and 6 to the terminal elements 7 and 8, the composite member 25 is closed at both sides with covers 19. The resultant structure can then be divided into individual components.

FIG. 15 again shows another embodiment of the component, whereby the cover 19 is formed of individual layers, for example hard paper strips 22. It may also be seen from the drawing that prepregs 23 have been employed as sealing. It can also be seen that parts 17 of the terminal elements 7 and 8 have been employed for fixing the spacing of the function member 2. Of course, the other sided possibilities of fixing the spacing can also be employed.

FIGS. 16, 17 and 18 show another embodiment of the terminal elements 7 and 8. The coatings 5 and 6 of the function member 2 are firmly joined to copper-laminated floor sections 30 and 31 by soldering, these floor sections serving as electrically conductive connection to the outer terminal caps 28 and 29.

FIG. 17 shows that the outer terminal caps 28 and 29 can be provided with a bead 32 for better contacting of the copper track.

FIG. 18 shows how the function member 2, corresponding to the exemplary embodiment shown in FIGS. 16 and 17, rests on the floor sections 30 and 31, whereby the lower cover 19 of the housing in band form is shown. The cross sectional constriction 24 of the floor sections 30 and 31 can also be seen.

It will be understood that variations and modifications may be effected without departing from the spirit and scope of the novel concepts of the present invention.

What is claimed is:

1. A chip component (1) for fastening to contact locations on a circuit board comprising, in combination,
    an electrical or electronic function member (2), said function member having coatings (5, 6) on at least two outside surfaces (3, 4) of said function member,
    a plurality of band-shaped terminal elements (7, 8) for connecting said coatings to said contact locations,
    a prefabricated housing (9) of cup shape for containing said function member, said housing being composed of insulating material through which said terminal elements (7, 8) pass to form contact surfaces (26, 27),
    supporting elements (12) for holding said function member (2) in said housing (9), which supporting elements form at least one air gap (10) that is 1 mm or less wide and separates said function member (2) from inner housing surfaces (11) of said housing on all sides except at electrical contact surfaces (13) where said function member (2) contacts said supporting elements (12), the size of said electrical contact surfaces (13) of said supporting elements being extremely small in comparison to the surface of the function member (2).

2. The chip component according to claim 1, characterized in that the clearance of the air gap is in the range of 0.1 mm through 0.3 mm.

3. The chip component according to claim 1, characterized in that the wall thickness of the housing is in the range of 0.1 through 0.7 mm.

4. The chip component according to claim 1, characterized in that the wall thickness of the housing is in the range of 0.2 through 0.4 m.

5. The chip component according to claim 1, characterized in that the housing (9) has two housing parts (18, 19) and is composed of duroplastics or thermoplastics.

6. A chip component according to claim 5, characterized in that the housing parts (18, 19) are sealed to one another by heat deformation, welding with ultrasound, laser, flame, hot air or by gluing.

7. The chip component according to claim 5, characterized in that the housing parts (18, 19) are formed of layered hard paper strips (22) and are joined by gluing.

8. The chip component according to claim 5, characterized in that the housing parts (18, 19) are formed of an exclusive layering of prefabricated, multi-layer plies or prepregs (23).

9. The chip component according to claim 5, characterized in that the housing parts (18, 19) are formed of layered hard fabric strips (22) and are joined by gluing.

10. The chip component according to claim 5, characterized in that the housing parts (18, 19) are formed with prefabricated prepregs (23).

11. The chip component according to claim 5, characterized in that said two housing parts is a cup (18) with a cover (19), said cup (18) and cover (19) being fashioned in the form of half-shells.

12. The chip component according to claim 11, characterized in that said cover (19) is attached to said cup (18) via a hinge (20) and said terminal elements (7, 8) are injected into said cover (19).

13. The chip component according to claim 1, characterized in that said housing (9) is formed of a housing frame (21) with terminal elements (7, 8) and two covers (19).

14. The chip component according to claim 1, characterized in that said terminal elements (7, 8) are composed of sheet metal that is pre-plated with tin.

15. The chip component according to claim 1, characterized in that an additional sealing an adhesion-promoting coat is provided at the location of the passage of the terminal elements (7, 8) through said housing (9).

16. The chip component according to claim 1, characterized in that the terminal elements (7, 8) comprise at least one construction (24) serving as heat trap, said terminal elements having a significant part located inside said housing (9).

17. The chip component according to claim 1, characterized in that the supporting elements (12) are fashioned as spacer bosses (14), ribs (15) or as bevelled corners (16) and said supporting elements are formed on said inner housing surfaces.

18. The chip component according to claim 1, characterized in that the supporting elements (12) are fashioned as spacer bosses (14), ribs (15) or as bevelled corners (16) and said supporting elements are formed by parts (17) of said terminal elements (7, 8) that project from the function member (2).

19. The chip component according to claim 1, characterized in that said housing is composed of a housing frame (21) and two covers (19); said terminal elements (7, 8) are bipartite and are formed of terminal caps (28, 29) situated outside of the housing (9) and floor sections (30, 31) composed of laminate having a copper surface on at least one side, said floor sections being secured to one of the covers (19), said function member (2) and said housing frame (21) both resting on said floor sections and being soldered to said copper surface, whereby said floor sections produce an electrically conductive connection to said terminal caps (28, 29).

* * * * *